(12) United States Patent
Franken

(10) Patent No.: US 6,734,949 B2
(45) Date of Patent: May 11, 2004

(54) LITHOGRAPHIC APPARATUS AND DEVICE MANUFACTURING METHOD

(75) Inventor: Dominicus Jacobus Petrus Adrianus Franken, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/289,448

(22) Filed: Nov. 7, 2002

(65) Prior Publication Data

US 2003/0090641 A1 May 15, 2003

(30) Foreign Application Priority Data

Nov. 7, 2001 (EP) .............................. 01309439

(51) Int. Cl.[7] .................. G03B 27/42; G03B 27/58; G33B 27/62
(52) U.S. Cl. .............. 355/53; 355/72; 355/75
(58) Field of Search .............. 355/53, 72–76; 359/704, 818; 356/399–401; 250/548

(56) References Cited

U.S. PATENT DOCUMENTS

| 4,974,018 A | * | 11/1990 | Komoriya et al. ............ 355/53 |
| 5,953,106 A | * | 9/1999 | Unno et al. .................... 355/55 |
| 6,147,818 A | | 11/2000 | Hale et al. |
| 2002/0163741 A1 | * | 11/2002 | Shibazaki .................... 359/819 |

FOREIGN PATENT DOCUMENTS

| EP | 0 620 464 A2 | 4/1993 |
| EP | 0 620 464 A3 | 10/1994 |
| EP | 1 182 485 A2 | 2/2002 |
| JP | 10-186198 | 7/1998 |
| JP | 2001-291665 | 10/2001 |

* cited by examiner

Primary Examiner—Henry Hung Nguyen
(74) Attorney, Agent, or Firm—Pillsbury Winthrop LLP

(57) ABSTRACT

A lithographic projection apparatus including at least one of a radiation system and a projection system having at least one optical member, wherein the optical member is supported by and connected to a mounting frame which at least partially encloses the optical member and which is connected to at least one other component of at least one of the radiation system and the projection system.

14 Claims, 3 Drawing Sheets

LITHOGRAPHIC APPARATUS AND DEVICE MANUFACTURING METHOD

This application is based on and claims priority from European Patent Application 01309439.6 filed on Nov. 7, 2001, the contents of which are incorporated herein by reference.

BACKGROUND OF THE INVENTION

1. Field of the Invention

The present invention relates to a lithographic projection apparatus.

2. Description of Related Art

The term "patterning structure" as here employed should be broadly interpreted as referring to a structure that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

- A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

- A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using a suitable electronic structure. More information on such mirror arrays can be gleaned, for example, from U.S. Pat. No. 5,296,891 and U.S. Pat. No. 5,523,193, which are incorporated herein by reference. In the case of a programmable mirror array, the said support structure may be embodied as a frame or table, for example, which may be fixed or movable as required.

- A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

A lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

To reduce the size of features that can be imaged, it is desirable to reduce the wavelength of the projection beam of radiation. It has been proposed to use wavelengths of less than about 200 nm, for example 193 nm, 157 nm or 126 nm. Further reductions in the wavelength to the range of EUV (extreme ultra-violet radiation, e.g. having a wavelength in the range of 5–20 nm) are envisaged. Such wavelengths in particular are more conveniently focused and controlled by reflective optics, such as mirrors. However, mirrors in lithography apparatus must be positioned to especially high accuracy, as compared to refractive elements, because any rotational orientation errors are magnified by the total downstream optical path length. In any apparatus using very short wavelength radiation, the optical path length may be of the order of 2 m or more.

For example, to have a good overlay performance, it can be necessary to keep the position of an image of an irradiated portion of the mask stable at a given position at substrate level with an error (e) of less than about 1 nm in particular when EUV is used. If the distance between the mirror and the substrate is 2 m the maximum permissible rotational error of the reflected beam, to keep the system within specification, is $28 \times 10^{-9}$ degrees ($1 \times 10^{-9}$ m/2 m=tan ($28 \times 10^{-9}$ degrees)), if e=1 nm. Since, for a mirror, the angle of reflection equals the angle of incidence, a rotational error in the position of the mirror will give rise to twice as large an error in the direction of the reflected beam. Thus, the mirror must be positioned with an accuracy of $14 \times 10^{-9}$ degrees or better. If the mirror has a width in the order of 0.1 m and a rotating point at one side, that rotating point must be positioned to within 0.024 nm (tan $14 \times 10^{-9} \times 0.1 = 2.4 \times 10^{-11}$). Clearly, the accuracy with which such a mirror must be orientated is extremely high and will only increase as the specification for image accuracy increases. The accuracy requirements for position in X, Y and Z are less demanding, as such errors are magnified less at substrate level, but still remain high.

The projection system of a lithographic projection apparatus that is used in "scan mode" (the meaning of "scan mode" has been explained before and will be explained hereafter with reference to the accompanying drawings) and that uses EUV may include six mirrors, for example, for reflecting and thereby projecting the patterned beam onto a target portion of the substrate. In this case, the mirrors are to be positioned relative to each other with an accuracy of about 0.1 nm. It has been proposed before to use a plurality of actuators for adjusting the position and/or orientation of a reflective optical element. For example, a corresponding arrangement is described in EP 1107068 A2. This document describes the use of position sensors to maintain the reflective element stationary in spite of vibrations that might occur.

An optical member generally has six independent degrees of freedom (DOF), three transational and three rotational DOF. One possibility to adjust the optical member with respect to more than one DOF is to use a plurality of actuators. The actuators may be piezoelectric, electroresistive or magnetoresistive and act, for example, perpendicularly to a surface of the optical member which extends transversely to the beam of radiation incident at the optical member. In particular, when the desired maximum position error is in the region of 1 nm or smaller, the combination of the actuators or the combination of at least one actuator with other moveable devices, such as a gravity compensator, might deform the optical member, for example due to excessive and/or undesired differential forces.

SUMMARY OF INVENTION

It is an aspect of the present invention to provide a lithographic projection apparatus having at least one optical member wherein the apparatus comprises a structure for reducing or diminishing deformations of the optical member.

This and other aspects are achieved according to the invention in a lithographic apparatus including a radiation system that provides a projection beam of radiation; a support structure that supports a patterning structure, the patterning structure serves to pattern the projection beam according to a desired pattern; a substrate table that holds a substrate; and a projection system that projects the patterned beam onto a target portion of the substrate. At least one of the radiation system and the projection system comprises at least one optical member. The optical member is supported by and connected to a mounting frame which at least partially encloses the optical member and which is connected to at least one other component of at least one of the radiation system and the projection system.

The optical member is for example a mirror or a lens. In any case, the mounting frame shields the optical member against undesired influences which might be caused and/or transferred by the at least one other component of the lithographic projection apparatus to which the frame is connected. In particular, the frame can significantly reduce deformation of the optical member due to the frame's stiffness.

According to a preferred embodiment, a connection between the frame and the optical member comprises a membrane-like portion located in a cut-out area of the frame and held by the frame at its outer circumference. The optical member is connected to a central area of the membrane-like portion. For example, the membrane-like portion extends within a plane including its outer circumference and the central area where it is indirectly or directly connected to the optical member. Preferably the outer circumference extends along a circular line. In particular, if the membrane-like portion is a thin sheet of material, the membrane-like portion may be circular. However, it is most preferred that the membrane-like portion comprises a plurality of spokes which extend from the central area to the outer circumference. The spokes may be separate parts of the membrane-like portion or may be connected by at least one further part of the membrane-like portion, for example by a ring-like part at the outer circumference and/or in the central area.

Generally, the membrane-like portion decouples the optical member from the frame with respect to deformations of the frame that might occur in spite of the frame's stiffness. In particular, the membrane-like portion may deform in a first direction perpendicular to a second direction in which the membrane-like portion extends. Thereby the membrane-like portion can compensate a deformation of the frame in a direction opposite to the first direction. As a result the optical member stays in place, without deformation or displacement. The membrane-like portion is also able to decouple translation of the frame along a direction perpendicular to the plane of the membrane-like portion. In case the membrane-like portion is sheet-like, it can decouple the optical member from the frame regarding deformations of the frame in at least (but not only) two rotational degrees of freedom (DOFs) namely the DOFs with respect to two perpendicular rotational axis extending within the plane in which the sheet-like portion extends.

In case the membrane-like portion comprises the spokes, it can decouple the optical member even regarding the rotational DOF with respect to the rotational axis that extends through the center of the spokes perpendicularly to a plane in which and/or along which the spokes extend.

The decoupling regarding rotational DOF is particularly useful, if the membrane-like portion is used for connecting the optical member to the frame in order to provide enough stiffness in one or two linear DOFs in which the optical member is to be moved or displaced, but to avoid undesired displacement in the other DOFs. For example, an actuator or an arrangement of plural actuators which causes displacement in the desired DOF might also cause undesired displacement or deformation of the frame in the other DOFs In a particular embodiment, the frame comprises a plurality of struts which may extend within a plane of the frame within which the optical member is enclosed by the frame. The struts are connected at corners of the frame so as to form a frame structure with at least three corners. Preferably, the frame structure has exactly three corners where the struts are connected. According to this embodiment, the frame is particularly stiff and light.

If the struts extend within a plane, the stiffness with respect to undesired forces acting from the outside of the frame in one of the directions of the plane is particularly large. On the other hand, the planar structure allows radiation to be incident at the optical member in a wide sector of directions transverse to the plane in which the struts extend.

The frame structure may comprise a corner element which connects two of the struts at one of the corners of the frame structure. In particular, the corner element may serve to establish a connection of the frame to the at least one other component of the apparatus. For example, the corner element may be an actuator or part of an actuator for adjusting and/or amending the position of the optical member.

The stiffness of the frame can be further improved by a stiffening member for stiffening the frame structure wherein the stiffening member extends between two of the struts which are connected at one of the corners so as to connect the two struts and so as to leave a hollow space in between the two struts, the stiffening member and the corner. Also, it is possible to provide pairs or groups of stiffening members located at the surface of the same hollow space. Further, the stiffness can be improved by providing a member which fills the angle between the two struts in the region of the corner where the two struts are connected.

The outer configuration of the struts may be plate-like which means that the outer dimensions are equal to the dimensions of a plate. The struts may be solid or hollow, in order to reduce the weight. The plate-like struts may each extend between two of the corners wherein the widths of the struts in a direction perpendicular to said plane are greater than a thickness of the struts measured in said plane in a direction perpendicular to a line which connects the respective two corners. This construction is light and stiff, not only with respect to direction in the plane of the frame structure, but also with respect to directions transverse to this plane.

Preferably, two struts which are connected to each other have equal lengths and are arranged symmetrically to each other. Most preferably, all side lengths of the frame structure between the corners are equal. A regular and symmetric structure comprises equal stiffnesses with respect to different directions and is particularly stiff.

In particular, if the frame structure has equal side lengths, the optical member is preferably connected to the frame structure at respective locations half way between each two of the corners. Especially for regularly and/or symmetrically shaped optical members, this embodiment enables to keep the lengths of the connections between the frame structure and the optical member short. A short connection is less likely to deform with large amplitudes. Further, the equally sided frame can effectively decouple the optical member from the at least one other component of the apparatus with respect to deformations, in particular when the other component is connected to the frame at one of the corners.

Preferably the frame is symmetric to the plane in which the frame extends. Furthermore, it is preferred that the optical member is arranged symmetrically to the plane. Generally, a symmetric arrangement is more resistant to undesired deformations, for example due to changes in temperature.

In one embodiment of the invention, at least one actuator for adjusting the position and/or the orientation of the frame and thereby of the optical member is connected to the frame. Preferably a direction or rotational axis of an actuation caused by the actuator is aligned with an axis of symmetry of the frame and/or the actuation direction or rotational axis is part of the plane in which the frame extends. In particular, the connection of the actuator to the frame is established at a location which includes a point or area within said plane.

It is a further aspect of the invention to provide a lithographic projection apparatus manufacturing method including providing a radiation system that provides a projection beam of radiation; providing a support structure adapted to support a patterning structure, the patterning structure serving to pattern the projection beam according to a desired pattern; providing a substrate table adapted to hold a substrate; providing a projection system that projects the patterned beam onto a target portion of the substrate; providing at least one optical member; and supporting the optical member by connecting the optical member to a mounting frame which at least partially encloses the optical member and which is connected to at least one other component of at least one of the radiation system and the projection system.

According to a further aspect of the invention there is provided a device manufacturing method including providing a substrate that is at least partially covered by a layer of radiation-sensitive material; providing a projection beam of radiation using a radiation system; endowing the projection beam with a pattern in its cross-section; and projecting the patterned beam of radiation onto a target portion of the layer of radiation-sensitive material using a projection system. At least one of the projection beam and the patterned beam passes through at least one optical member that is supported and is partially enclosed by a mounting frame which is connected to at least one other component of at least one of the radiation system and the projection system. The frame extends in a plane transverse to a path of radiation to or from the optical member and the frame thereby enclosing, within in said plane, the optical member, wherein the optical member is connected to the frame and the frame is connected to at least one of the other components.

In a preferred embodiment, the method includes adjusting the propagation direction of the projection beam of radiation or of the patterned beam by adjusting at least one of the position and the orientation of the mounting frame, thereby adjusting at least one of the position and the orientation of the optical member. Due to the stiffness and/or the decoupling effect of the mounting frame that are described above, the position and/or the orientation of the mounting frame can be kept very stable. For example, it is therefore possible to reduce the dimensions of structures which are generated by lithography on a substrate, in particular when short-wave radiation is used, e.g. EUV.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION OF PREFERRED EMBODIMENTS

Embodiment 1

Figure 1:
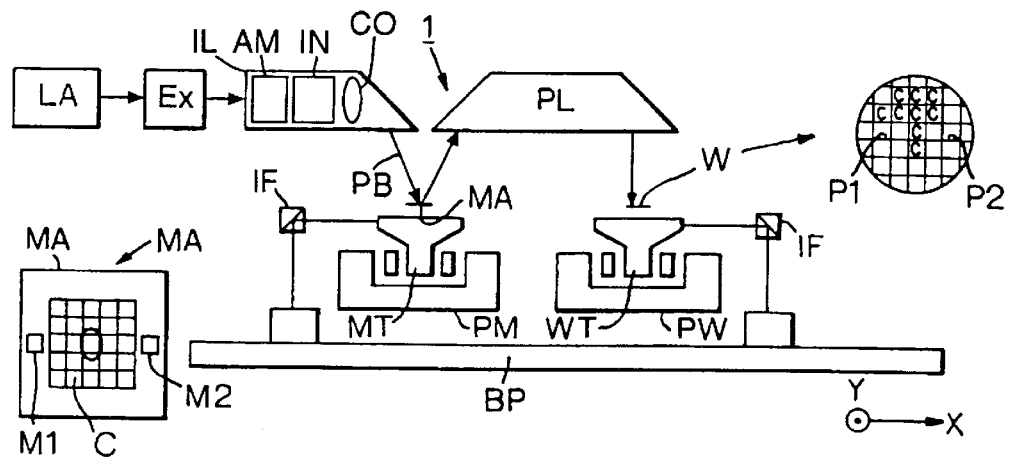
FIG. 1 depicts a lithographic projection apparatus according to an embodiment of the invention.

FIG. 1 schematically depicts a lithographic projection apparatus 1 according to a particular embodiment of the invention. The apparatus 1 includes a radiation system Ex, IL, for supplying a projection beam PB of radiation (e.g. EUV), which in this particular case also comprises a radiation source LA; a first object table (mask table) MT provided with a mask holder for holding a mask MA (e.g. a reticle), and connected to a first positioning structure for accurately positioning the mask with respect to item PL; a second object table (substrate table) WT provided with a substrate holder for holding a substrate W (e.g. a resist-coated silicon wafer), and connected to a second positioning structure for accurately positioning the substrate with respect to item PL; and a projection system ("lens") PL (e.g. a refractive or catadioptric system or a reflective system) for imaging an irradiated portion of the mask MA onto a target portion C (e.g. comprising one or more dies) of the substrate W.

As here depicted, the apparatus 1 is of a reflective type (i.e. has a reflective mask). However, in general, it may also be of a transmissive type, for example (with a transmissive mask). Alternatively, the apparatus 1 may employ another kind of patterning structure, such as a programmable mirror array of a type as referred to above.

The source LA (e.g. an undulator or wiggler provided around the path of an electron beam in a storage ring or synchrotron, or a mercury lamp) produces a beam of radiation. This beam is fed into an illumination system (illuminator) IL, either directly or after having a traversed conditioning structure, such as a beam expander Ex, for example. The illuminator IL may comprise an adjusting structure AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB reflected by the mask MA has a desired uniformity and intensity distribution in its cross-section.

It should be noted with regard to FIG. 1 that the source LA may be within the housing of the lithographic projection apparatus 1 (as is often the case when the source LA is a mercury lamp, for example), but that it may also be remote from the lithographic projection apparatus 1, the radiation beam which it produces being led into the apparatus 1 (e.g. with the aid of suitable directing mirrors); this latter scenario is often the case when the source LA is an excimer laser. The current invention encompasses both of these scenarios.

The beam PB subsequently intercepts the mask MA, which is held on a mask table MT. After being selectively reflected by the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus 1 can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB.

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
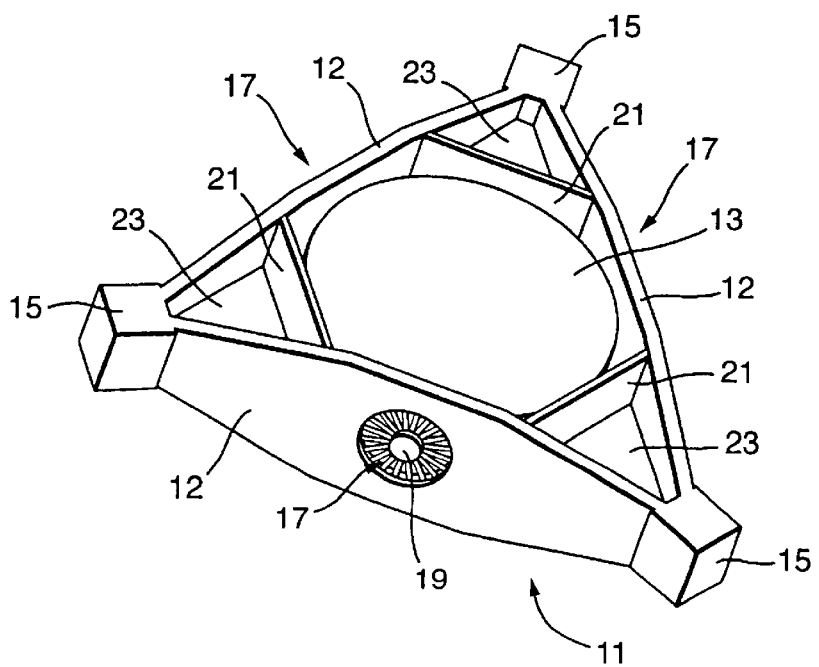
FIG. 2 shows a perspective view of a mirror that is connected to a mounting frame.

FIG. 2 shows a mounting frame 11 having a triangular frame structure. An optical member 13, in particular a mirror, for refracting and/or reflecting radiation that is incident at the circular surface of the optical member 13 shown in the figure is connected to the mounting frame 11. The optical member 13 may have a concave or convex optical surface and is symmetric to an axis of rotational symmetry extending through the center of its circular cross section.

The mounting frame comprises three corner blocks 15 that are positioned at the three corners of the triangular structure. Each corner block 15 connects two plate-like struts 12 which define sides of the triangular structure and connect the two respective corner blocks 15 at their two opposite ends. Preferably, the lengths of the three struts 12 between the corner blocks 15 are equal and the struts 12 and the corner blocks 15 have identical shapes.

This arrangement should be understood as schematic example regarding the shape and function of the corner blocks 15. In practice, each corner block 15 might be connected to or part of an actuator or an arrangement of actuators for adjusting the position of the optical member 13.

Within the areas of the acute angles at the three corners of the triangular structure there are provided first and second stiffening members 21, 23. Next to the circular circumference of the optical member 13 and in between the circumference and a respective corner block 15 there is each one of the first stiffening members 21 per corner. The first stiffening members 21 are plate-like and extend between the two respective struts 12 which are connected at the respective corner block 15 so as to connect the two struts 12. All locations where the first stiffening members 21 are connected to the struts 12 have the same distance to the respective corner blocks 15. Further, the plate-like first stiffening members 21 extend in vertical direction perpendicular to a plane of symmetry of the frame. This plane of symmetry cuts the frame in an upper and a lower half and extends through all three corner blocks 15. The thickness of the first stiffening members 21, measured in a direction from the respective corner to the center of the optical member 13 is smaller than the thickness of the struts 12 measured in a direction perpendicular to a line that connects two respective corner blocks 15 of the respective strut 12 and which is within or parallel to the plane of symmetry. Preferably, the thickness of the first and/or second stiffening members 21, 23 and/or of the struts 12 is constant.

Each one of the second stiffening members 23 extends within the plane of symmetry between a respective one of the first stiffening members 21 and the respective corner block 15 so as to fill the triangular-shaped gap between the first stiffening member 21 and the corner block 15 and between the two respective struts 12 which are connected at the respective corner block 15. For example, the second stiffening members 23 have the same thickness as the first stiffening members 21. The thickness of the second stiffening members 23 is measured in a direction perpendicular to the plane of symmetry. As a result, since the first stiffening members 21 extend on both sides of the plane of symmetry, each group of the corner block 15, of the two respective struts 12 which are connected at the corner block 15 and of the respective first and second stiffening member 21, 23 define two hollow spaces, one on each side of the plane of symmetry. The three upper hollow spaces, which are on the upper side of the plane of symmetry can be recognized from FIG. 2. "Upper" and "lower" or "vertical" and "horizontal" are only related to the view shown in FIG. 2 and do not limit the possibilities of positioning the mounting frame and the optical member. For example, the plane of symmetry may extend in vertical direction in a projection system of a photographic projection apparatus.

The basic triangular structure of the mounting frame 11 shown in FIG. 2 with its equal side lengths results in a good stiffness of the frame. Due to the first and second stiffening members 21, 23 the stiffness is further improved without increasing the weight of the frame significantly.

The corner blocks 15 define, for example, regions where each at least one actuator for adjusting the position and/or the orientation of the frame and thereby of the optical member is connected to the struts 12. Preferably, such actuators are connected symmetrically to the plane of symmetry that cuts the frame in an upper and a lower half. The height of the struts 12, which is measured in a direction perpendicular to the plane of symmetry, may vary along their extension between the two respective corner blocks 15 which are connected by the respective strut 12. Preferably, the height of the struts 12 is smallest at one of the corner blocks 15 and increases gradually to an area midway between the corner blocks, which area has a constant height. The strut 12 is symmetric around a central plane perpendicular to the strut and parallel to its height. In the area mid way between the two corner blocks 15 the struts 12 comprise a cut-out area which is, as shown, preferably of circular shape. Within the region of the cut-out area the height of the struts 12 is greater so that there is sufficient material on all sides of the cut-out area to ensure the stiffness and stability of the struts 12. However, for example, if the height of the corner blocks would be greater and/or the size of the cut-out areas smaller, the height differences of the struts can be smaller or the height can even be constant.

Figure 3:
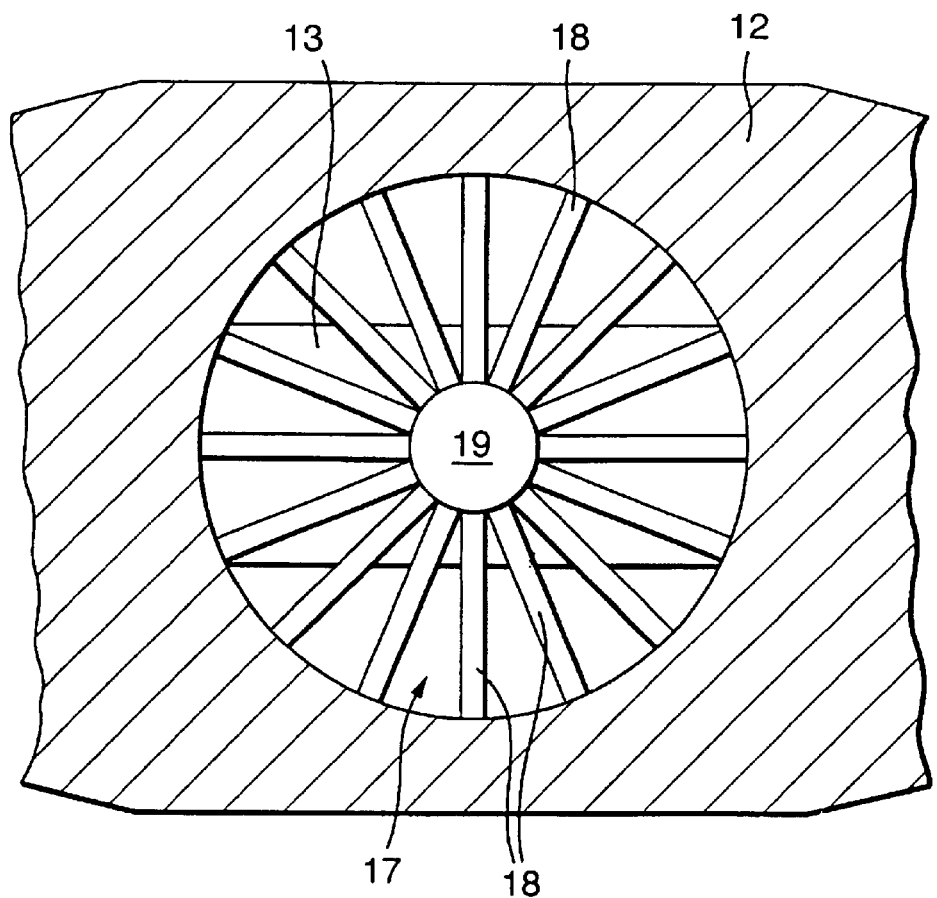
FIG. 3 depicts a detail of a mounting frame and a connected optical member similar to the arrangement of FIG. 2.

In each of the cut-out areas a membrane 17 is inserted and firmly connected at its outer circumference to the rim of the cut-out area. The membranes can be sheet-like, but the configuration of the membranes 17 shown in FIGS. 2 and 3 is preferred. The membranes 17 comprise a plurality of spokes 18 (FIG. 3) which extend between the rim of the cut-out area and a joint 19 which is part of or connection to the optical member 13. The number and dimensions of the spokes 18 may vary, and can in particular be adjusted to adjust the decoupling properties of the membrane 17. Generally, decoupling means that the optical member is decoupled from adverse mechanical conditions which may apply to the mounting frame, such as undesired forces that act on the mounting frame 11 or are caused by deformations of the frame. Furthermore, the shape of the spoked membrane can be different, for example, the spokes may be connected to a ring-like portion of the membrane at the outer and/or inner circumference of the membrane.

The mounting frame 11 and the membrane 17 may be a single part, for example made of a block of the same material. However, it is preferred that at least the membranes 17 are manufactured separately from the frame 11 or from parts of the frame 11 and are connected in a later manufacturing step to the frame 11 or parts of the frame 11. Also, parts of the frame 11, such as the struts 12, the corner blocks 15 and the first and second stiffening members 21, 23 can be manufactured separately and jointed together. This applies in particular, if the corner blocks 15 are actuators or part of actuators. One advantage of separately manufacturing the membranes 17 and/or parts of the frame 11 is that the most appropriate and suitable material and/or manufacturing process can be selected for the respective parts or members. In particular, it may be desirable to choose a specific material for the membranes 17 in order to achieve specific de-coupling properties.

A preferred material for the frame 11 or for at least the struts 12 is SiC, either as a sole material or in combination with other materials. Other examples of materials for the frame 11, or parts of it, are Invar, stainless steel or ceramic materials, in general.

FIG. 3 shows a side view of a portion of a mounting frame and of an optical member 13 similar to the arrangement shown in FIG. 2. FIG. 3 depicts a portion of one of the struts 12 in the region of the cut-out part where the membrane 17 is located. Behind the membrane 17 and the joint 19 a portion of the optical member 13 can be seen. The membrane 17 shown in FIG. 3 has a different number of spokes 18 compared to the membrane 17 shown in FIG. 2.

Figure 4:
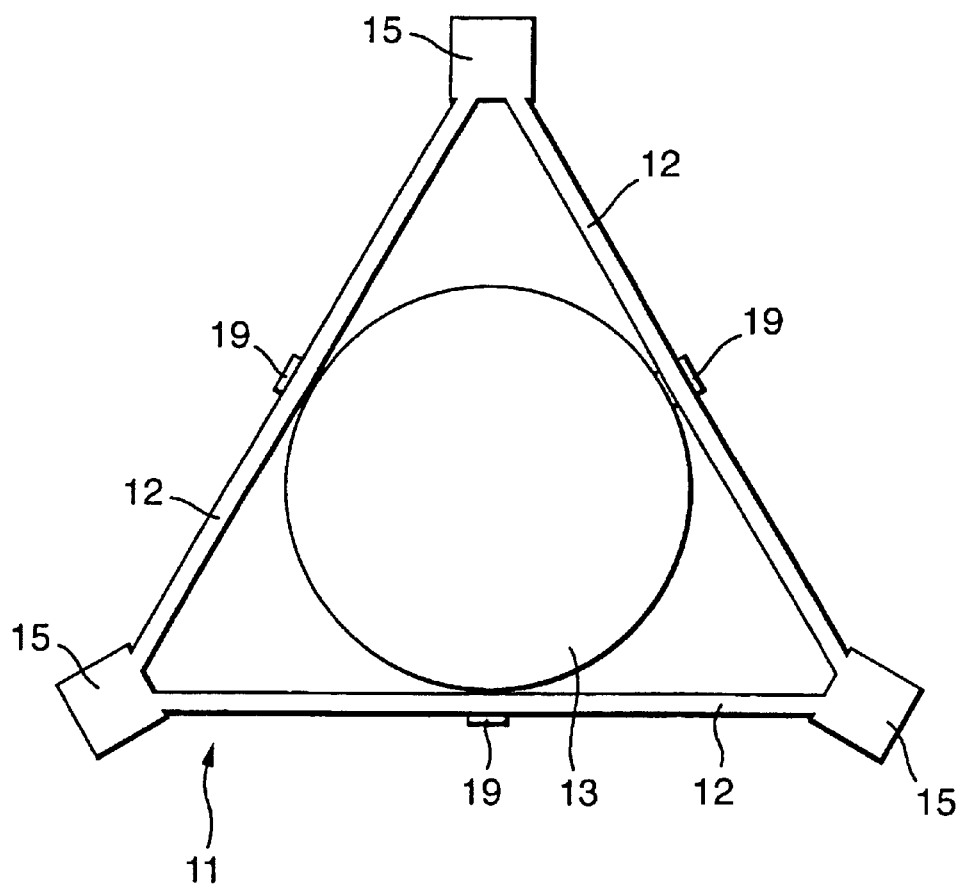
FIG. 4 shows a top view of an arrangement of an optical member that is connected to a mounting frame similar to the arrangement of FIG. 2.

FIG. 4 shows a top view of an arrangement of an optical member 13 connected to a frame 11 similar to the arrangement shown in FIG. 2. However, the frame 11 shown in FIG. 4 does not have first and second stiffening members as the frame 11 shown in FIG. 2. Furthermore, the optical member 13 has a regular polygonal shape instead of the circular shape of the optical member 13 shown in FIG. 2. In general, the optical membrane may have a different shape than circular or polygonal, for example elliptical or having a cross section like a banana.

Whilst specific embodiments of the invention have been described above, it will be appreciated that the invention may be practiced otherwise than as described. The description is not intended to limit the invention.

What is claimed is:

1. A lithographic projection apparatus comprising:
   a radiation system that provides a projection beam of radiation;
   a support structure that supports a patterning structure, the patterning structure serves to pattern the projection beam according to a desired pattern;
   a substrate table that holds a substrate; and
   a projection system that projects the patterned beam onto a target portion of the substrate;
   wherein at least one of the radiation system and the projection system comprises at least one optical member;
   wherein the optical member is supported by and connected to a mounting frame which at least partially encloses the optical member and which is connected to at least one other component of at least one of the radiation system and the projection system;
   wherein the frame comprises a plurality of struts which are connected at corners of the frame so as to form a frame structure with at least three corners.

2. An apparatus according to claim 1, wherein all side lengths of the frame structure between the corners are equal.

3. An apparatus according to claim 1, wherein the optical member is connected to the frame structure at respective locations halfway between each two of the corners.

4. An apparatus according to claim 1, wherein at least one actuator that adjusts at least one of the position and the orientation of the frame and thereby of the optical member is connected to the frame.

5. An apparatus according to claim 4, wherein the connection of the actuator to the frame is established at a location which includes a point or area within a symmetry plane of the frame.

6. An apparatus according to claim 1, wherein a connection between the frame and the optical member comprises a membrane-like portion located in a cut-out area of the frame and held by the frame at its outer circumference, wherein the optical member is connected to a central area of the membrane-like portion.

7. An apparatus according to claim 6, wherein the membrane-like portion comprises a plurality of spokes which extend from the central area to the outer circumference of the membrane-like portion.

8. An apparatus according to claim 1, wherein the frame is substantially triangular.

9. An apparatus according to claim 1, wherein the frame further comprises at least one stiffening member disposed between adjacent struts.

10. An apparatus according to claim 9, wherein the stiffening member extends in a vertical direction perpendicular to a plane of symmetry of the frame, wherein the plane of symmetry cuts the frame in an upper half and a lower half.

11. An apparatus according to claim 9, wherein the stiffening member is disposed within a plane of symmetry of the frame, wherein the plane of symmetry cuts the frame in an upper half and a lower half.

12. A lithographic projection apparatus manufacturing method comprising;
   providing a radiation system that provides a projection beam of radiation;
   providing a support structure adapted to support a patterning structure, the patterning structure serving to pattern the projection beam according to a desired pattern;
   providing a substrate table adapted to hold a substrate;
   providing a projection system that projects the patterned beam onto a target portion of the substrate;
   providing at least one optical member; and
   supporting the optical member by connecting the optical member to a mounting frame which at least partially encloses the optical member and which is connected to at least one other component of at least one of the radiation system and the projection system and which comprises a plurality of struts which are connected at corners of the frame so as to form a frame structure with at least three corners.

13. A device manufacturing method comprising:
   providing a substrate that is at least partially covered by a layer of radiation-sensitive material;
   providing a projection beam of radiation using a radiation system;
   endowing the projection beam with a pattern in its cross-section; and
   projecting the patterned beam of radiation onto a target portion of the layer of radiation-sensitive material using a projection system;
   wherein at least one of the projection beam and the patterned beam passes through at least one optical member that is supported and is partially enclosed by a mounting frame which is connected to at least one other component of at least one of the radiation system and the projection system and which comprises a plurality of struts which are connected at corners of the frame so as to form a frame structure with at least three corners.

14. A method according to claim 13, wherein the propagation direction of the projection beam of radiation or of the patterned beam is adjusted by adjusting at least one of the position and the orientation of the mounting frame, thereby adjusting at least one of the position and the orientation of the optical member.

\* \* \* \* \*